(12) United States Patent
Jang et al.

(10) Patent No.: US 11,823,753 B2
(45) Date of Patent: Nov. 21, 2023

(54) NON-VOLATILE MEMORY DEVICE, PROGRAMMING METHOD THEREOF, AND STORAGE DEVICE HAVING THE SAME

(71) Applicant: SAMSUNG ELECTRONICS CO., LTD., Suwon-si (KR)

(72) Inventors: Joonsuc Jang, Hwaseong-si (KR); Hyunggon Kim, Hwaseong-si (KR); Sangbum Yun, Seoul (KR); Dongwook Kim, Seoul (KR); Kyungsoo Park, Busan (KR); Sejin Baek, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/128,596

(22) Filed: Mar. 30, 2023

(65) Prior Publication Data

US 2023/0238066 A1    Jul. 27, 2023

Related U.S. Application Data

(63) Continuation of application No. 17/201,828, filed on Mar. 15, 2021, now Pat. No. 11,626,171.

(30) Foreign Application Priority Data

Sep. 9, 2020    (KR) .................. 10-2020-0115545

(51) Int. Cl.
| | | |
|---|---|---|
| *G11C 16/34* | (2006.01) | |
| *G11C 16/10* | (2006.01) | |
| *G11C 16/26* | (2006.01) | |
| *G11C 16/30* | (2006.01) | |
| *G11C 7/10* | (2006.01) | |
| *G11C 16/24* | (2006.01) | |

(52) U.S. Cl.
CPC .......... *G11C 16/3459* (2013.01); *G11C 7/106* (2013.01); *G11C 7/1045* (2013.01); *G11C 7/1048* (2013.01); *G11C 7/1087* (2013.01); *G11C 16/10* (2013.01); *G11C 16/24* (2013.01); *G11C 16/26* (2013.01); *G11C 16/30* (2013.01)

(58) Field of Classification Search
CPC ........................... G11C 16/34; G11C 16/3459
USPC ..................................................... 365/185.22
See application file for complete search history.

(56) References Cited

U.S. PATENT DOCUMENTS

| | | | |
|---|---|---|---|
| 6,552,929 B1 * | 4/2003 | Parker | G11C 16/12 365/185.18 |
| 8,130,556 B2 | 3/2012 | Lutze et al. | |
| 8,416,624 B2 | 4/2013 | Lei et al. | |
| 8,520,448 B1 | 8/2013 | Lutze et al. | |

(Continued)

*Primary Examiner* — Muna A Techane
(74) *Attorney, Agent, or Firm* — Sughrue Mion, PLLC

(57) ABSTRACT

A method of programming a nonvolatile memory device includes performing a single-pulse program operation in a program loop, determining whether a condition is satisfied in the a program loop, and performing a multi-pulse program operation in a next program loop when the condition is satisfied. The single-pulse program operation includes applying a first program pulse and applying plural verification pulses, the multi-pulse program operation includes applying a second program pulse, applying a third program pulse, and applying plural verification pulses, and each of the second program pulse and the third program pulse has a level lower than a level of the first program pulse.

20 Claims, 15 Drawing Sheets

(56) References Cited

U.S. PATENT DOCUMENTS

| | | | |
|---|---|---|---|
| RE45,813 E | | 11/2015 | Lee et al. |
| 9,275,751 B2 | | 3/2016 | Hahn et al. |
| 9,741,437 B2 | | 8/2017 | Lim et al. |
| 11,094,379 B1 | * | 8/2021 | Yip .................. G11C 16/10 |
| 2006/0109716 A1 | * | 5/2006 | Kim .................. G11C 16/30 |
| | | | 365/185.18 |
| 2011/0032757 A1 | * | 2/2011 | Dutta ................ G11C 16/3427 |
| | | | 365/189.05 |
| 2013/0208543 A1 | | 8/2013 | Park |
| 2016/0099061 A1 | * | 4/2016 | Ziperovich ............ G11C 16/16 |
| | | | 365/185.11 |
| 2019/0189215 A1 | | 6/2019 | Yang |

* cited by examiner

NON-VOLATILE MEMORY DEVICE, PROGRAMMING METHOD THEREOF, AND STORAGE DEVICE HAVING THE SAME

CROSS-REFERENCE TO RELATED APPLICATION(S)

This application is a continuation of U.S. application Ser. No. 17/201,828 filed on Mar. 15, 2021, which claims priority under 35 USC 119(a) of Korean Patent Application No. 10-2020-0115545 filed on Sep. 9, 2020 in the Korean Intellectual Property Office, the entire disclosures of each of which being incorporated by reference herein for all purposes.

BACKGROUND

1. Field

The present disclosure relates to a nonvolatile memory device, a programming method thereof, and a storage device including the same.

2. Description of Related Art

In general, pieces of storage data of flash memory devices are defined by threshold voltages of cells, and program operations are performed by changing threshold voltages of the cells. In general, a cell threshold voltage is controlled by an incremental operation pulse programming (ISPP) method during programming. When programming a memory cell using the ISPP method, the programming voltage applied to a wordline of the memory cell increases continuously in a stepwise manner until the program is completed. This high-voltage programming voltage causes a program disturbance to neighboring cells of the cell being programmed.

SUMMARY

It is an aspect to provide a nonvolatile memory device in which program disturbance is reduced, a programming method thereof, and a storage device.

It is another aspect to provide a nonvolatile memory device in which performance is improved while reducing program disturbance, a programming method thereof, and a storage device.

According to an aspect of one or more example embodiments, there is provided a method of programming a nonvolatile memory device. The method includes performing a single-pulse program operation in a program loop, determining whether a condition is satisfied in the program loop, and performing a multi-pulse program operation in a next program loop when the condition is satisfied. The single-pulse program operation includes applying a first program pulse and applying a plurality of verification pulses, the multi-pulse program operation includes applying a second program pulse, applying a third program pulse, and applying a plurality of verification pulses, and each of the second program pulse and the third program pulse has a level lower than a level of the first program pulse.

According to another aspect of one or more example embodiments, there is provided a nonvolatile memory device. The nonvolatile memory device includes a memory cell area having a first metal pad; a peripheral circuit area having a second metal pad and vertically connected through the first metal pad and the second metal pad, a memory cell array, in the memory cell area, the memory cell array including a plurality of memory blocks having a plurality of memory cells connected to a plurality of wordlines and a plurality of bitlines; a row decoder in the peripheral circuit area, the row decoder configured to select one of the plurality of wordlines; a page buffer circuit, in the peripheral circuit area, the page buffer circuit having a plurality of page buffers connected to the plurality of bitlines; and a control logic configured to receive a command latch enable (CLE) signal, an address latch enable (ALE) signal, a chip enable (CE) signal, a write enable (WE) signal, a read enable (RE) signal, and a DQS signal through control pins, and to perform a program operation by latching a command or an address at an edge of the WE signal in response to the CLE signal and the ALE signal, wherein the control logic includes a determination circuit that is configured to determine whether to perform a multi-pulse program operation to reduce a program disturbance, and the multi-pulse program operation includes applying a plurality of program pulses and applying a plurality of verification pulses.

According to yet another aspect of one or more example embodiments, there is provided a storage device. The storage device includes at least one nonvolatile memory device; and a controller configured to connect to control pins providing a command latch enable (CLE) signal, an address latch enable (ALE) signal, a chip enable (CE) signal, a write enable (WE) signal, a read enable (RE) signal, and a DQS signal to the at least one nonvolatile memory device, and configured to read data from the at least one nonvolatile memory device, wherein the at least one nonvolatile memory device performs a single-pulse program operation and a multi-pulse program operation by latching a command or an address at an edge of the WE signal in response to the CLE signal and the ALE signal, the single-pulse program operation includes applying one program pulse and applying a plurality of verification pulses, and the multi-pulse program operation includes applying a plurality of program pulses and applying the plurality of verification pulses.

BRIEF DESCRIPTION OF DRAWINGS

The above and other aspects will be more clearly understood from the following detailed description, taken in conjunction with the accompanying drawings, in which.

DETAILED DESCRIPTION

Hereinafter, example embodiments will be described with reference to the accompanying drawings.

Figure 1:
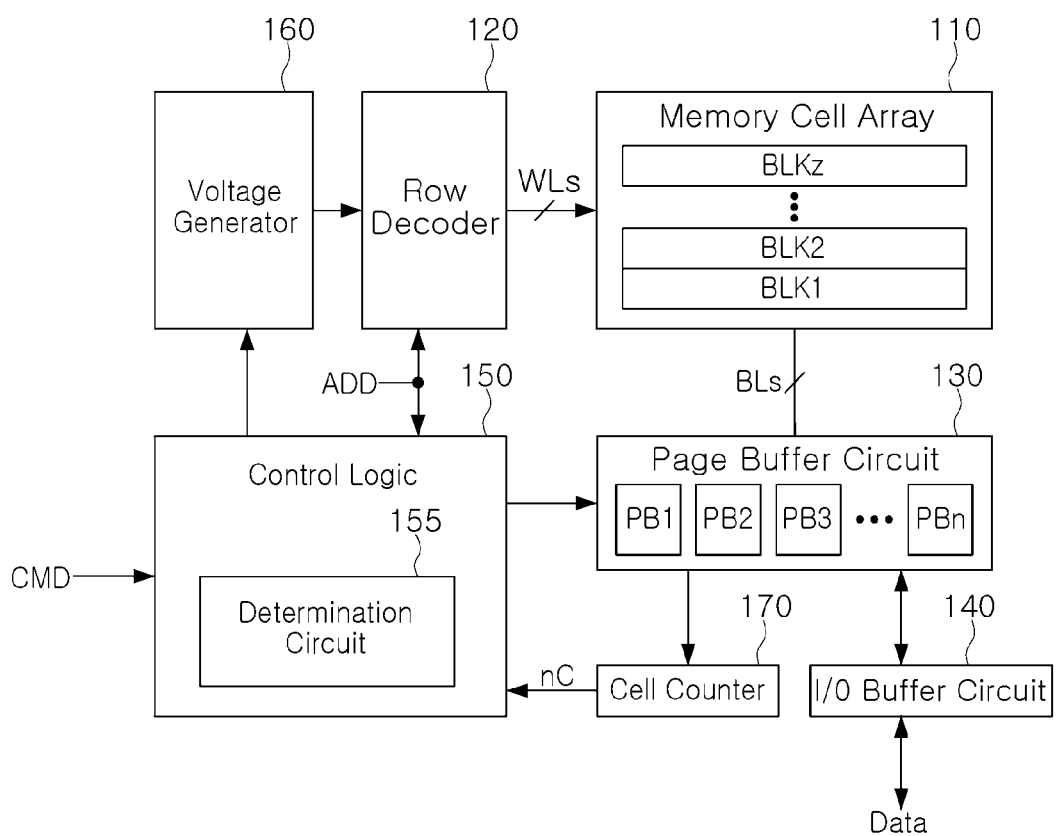
FIG. 1 is a diagram illustrating a nonvolatile memory device according to an example embodiment.

FIG. 1 is a diagram illustrating a nonvolatile memory device 100 according to an example embodiment. Referring to FIG. 1, the nonvolatile memory device 100 may include a memory cell array 110, a row decoder 120, a page buffer circuit 130, an input/output (I/O) buffer circuit 140, a control logic 150, a voltage generator 160, and a cell counter 170.

The memory cell array 110 may be connected to the row decoder 120 through wordlines WLs or select lines SSL and a ground select line GSL. The memory cell array 110 may be connected to the page buffer circuit 130 through bitlines BLs. The memory cell array 110 may include a plurality of cell strings. Each channel of the cell strings may be formed in a vertical or horizontal direction. Each of the cell strings may include a plurality of memory cells. In this case, the plurality of memory cells may be programmed, erased, or read by a voltage provided to the bitlines BLs or the wordlines WLs. In general, a program operation is performed on the basis of a page, and an erase operation is performed on the basis of a block.

The row decoder 120 may be implemented to select one of memory blocks BLK1 to BLKz (where z is an integer greater than or equal to 2) of the memory cell array 110 in response to an address ADD from the control logic 150. The row decoder 120 may select one of wordlines of the selected memory block in response to the address ADD. The row decoder 120 may transfer a wordline voltage VWL corresponding to an operation mode to the wordline WL of the selected memory block. During a program operation, the row decoder 120 may apply a programming voltage and a verification voltage to the selected wordline, and may apply a pass voltage to an unselected wordline. During a reading operation, the row decoder 120 may apply a read voltage to a selected wordline and a read pass voltage to an unselected wordline.

The page buffer circuit 130 may be implemented to operate as a write driver or a sense amplifier. During the program operation, the page buffer circuit 130 may apply a bitline voltage corresponding to data to be programmed to the bitlines of the memory cell array 110. During a reading operation or a verification reading operation, the page buffer circuit 130 may sense data stored in the selected memory cell through the bitline BL. Each of a plurality of page buffers PB1 to PBn (where n is an integer greater than or equal to 2) included in the page buffer circuit 130 may be connected to at least one bitline.

Each of the plurality of page buffers PB1 to PBn may be implemented to perform sensing and latch for performing an on-chip valley search (OVS) operation. For example, each of the plurality of page buffers PB1 to PBn may perform a plurality of sensing operations to identify any one state stored in the selected memory cells under the control of the control logic 150. In addition, after each of the plurality of page buffers PB1 to PBn stores data sensed through a plurality of sensing operations, any one piece of data may be selected under the control of the control logic 150. For example, each of the plurality of page buffers PB1 to PBn may perform a plurality of sensing operations to identify any one state. In addition, each of the plurality of page buffers PB1 to PBn may select or output optimal data from among a plurality of data sensed under the control of the control logic 150.

The input/output (I/O) buffer circuit 140 provides externally-provided data to the page buffer circuit 130. The input/output buffer circuit 140 may provide a command CMD provided from externally to the control logic 150. The input/output buffer circuit 140 may provide an externally provided address ADD to the control logic 150 or the row decoder 120. In addition, the input/output buffer circuit 140 may externally output data Data sensed and latched by the page buffer circuit 130.

The control logic 150 may be implemented to control the row decoder 120 and the page buffer circuit 130 in response to a command CMD transmitted from externally.

In addition, the control logic 150 may include a determination circuit 155. The determination circuit 155 may determine whether to apply a multi-pulse to reduce program disturbance in a program operation. The determination circuit 155 may determine whether a condition is satisfied while applying a single pulse in a program operation.

The condition may be one or more of various conditions according to various example embodiments. For example, in an example embodiment, the condition may be the number of program loops. In an example embodiment, the condition may be whether a program in a specific program state is passed. In an example embodiment, the condition may be the level of the programming voltage. In an example embodiment, the condition may be a value of data stored in a predetermined register. On the other hand, it should be understood that the conditions are not limited thereto, and according to other example embodiments, other conditions are contemplated.

The control logic 150 may be implemented to perform processing for selecting optimal data from among a plurality of pieces of sensed data. To select optimal data, the control logic 150 may refer to a count result (nC) provided from the cell counter 170.

The voltage generator 160 may be implemented to generate various types of wordline voltages to be applied to respective wordlines under the control of the control logic 150 and a well voltage to be supplied to a bulk (e.g., well region) in which memory cells are formed, by control of the control logic 150. Wordline voltages VWLs applied to respective wordlines may include a programming voltage, a pass voltage, a reading voltage, read pass voltages, and the like.

The cell counter 170 may be implemented to count memory cells corresponding to a specific threshold voltage range from data sensed by the page buffer circuit 130. For example, the cell counter 170 may count the number of memory cells having a threshold voltage in a specific threshold voltage range by processing data sensed in each of the plurality of page buffers PB1 to PBn.

In general, it is advantageous for nonvolatile memory devices to lower a voltage applied to a wordline during a program operation to reduce program disturbance of memory cells and improve reliability of transistor devices. To this end, a general nonvolatile memory device applies a long program pulse at a low voltage or a low voltage program pulse several times. However, when the program pulse is lengthened, there is a limit to the reduction in the disturbance due to leakage in channel boosting. In addition, in the case in which the number of times the program pulse is applied is increased, a time overhead for the wordline setup/recovery time for applying the pulse is caused.

The nonvolatile memory device 100 according to an example embodiment may reduce program disturbance in a program operation by applying a multi-pulse when a condition is satisfied. In addition, the nonvolatile memory device 100 according to an example embodiment is converted into a program operation that applies a multi-pulse when a condition is satisfied, so that time overhead may be significantly reduced.

Figure 2A:
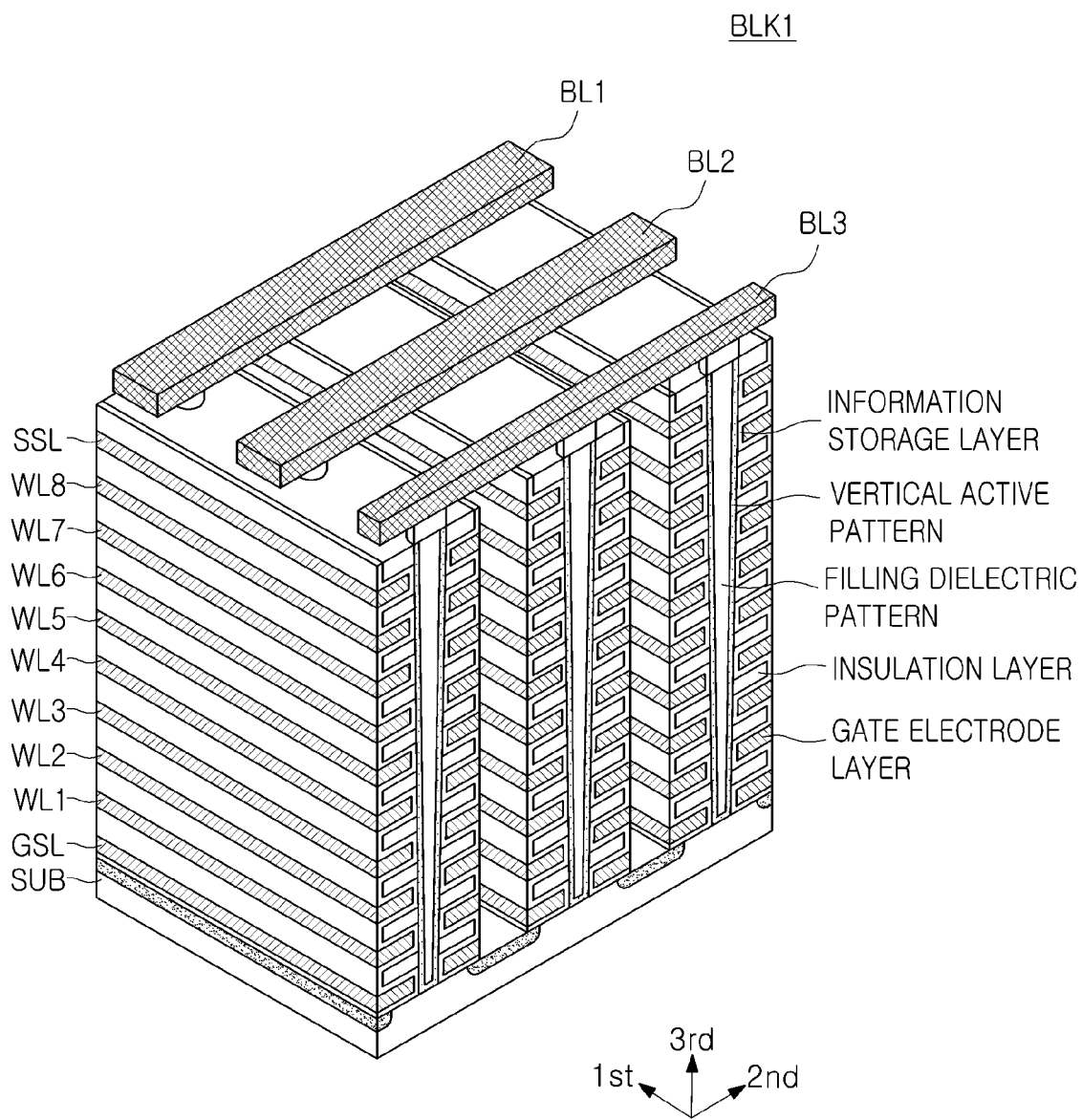
FIGS. 2A and 2B are views illustrating, as examples, memory blocks according to an example embodiment.

FIG. 2A is a diagram illustrating a memory block according to an example embodiment. Referring to FIG. 2A, the memory block BLK1 is formed in a direction perpendicular to a substrate SUB. An n⁺ doped region may be formed on the substrate SUB.

A gate electrode layer and an insulation layer may be alternately deposited on the substrate SUB. An information storage layer may be formed between the gate electrode layer and the insulation layer. When the gate electrode layer and the insulation layer are vertically patterned, a V-shaped pillar may be formed. The pillar may pass through the gate electrode layer and the insulation layer, to be connected to the substrate SUB. The inside of the pillar may be formed of an insulating material such as silicon oxide, as a filling dielectric pattern. The outside of the pillar may be formed of a channel semiconductor, as a vertical active pattern.

The gate electrode layer of the memory block BLK1 may be connected to a ground select line GSL, the plurality of wordlines WL1 to WL8, and the string select line SSL. In addition, the pillar of the memory block BLK1 may be connected to the plurality of bitlines BL1 to BL3. In FIG. 2A, one memory block BLK1 is illustrated to have two select lines, i.e., a ground select line GSL and a string select line SSL, eight wordlines WL1 to WL8, and three bitlines BL1 to BL3, but the configuration is not be limited thereto.

Figure 2B:
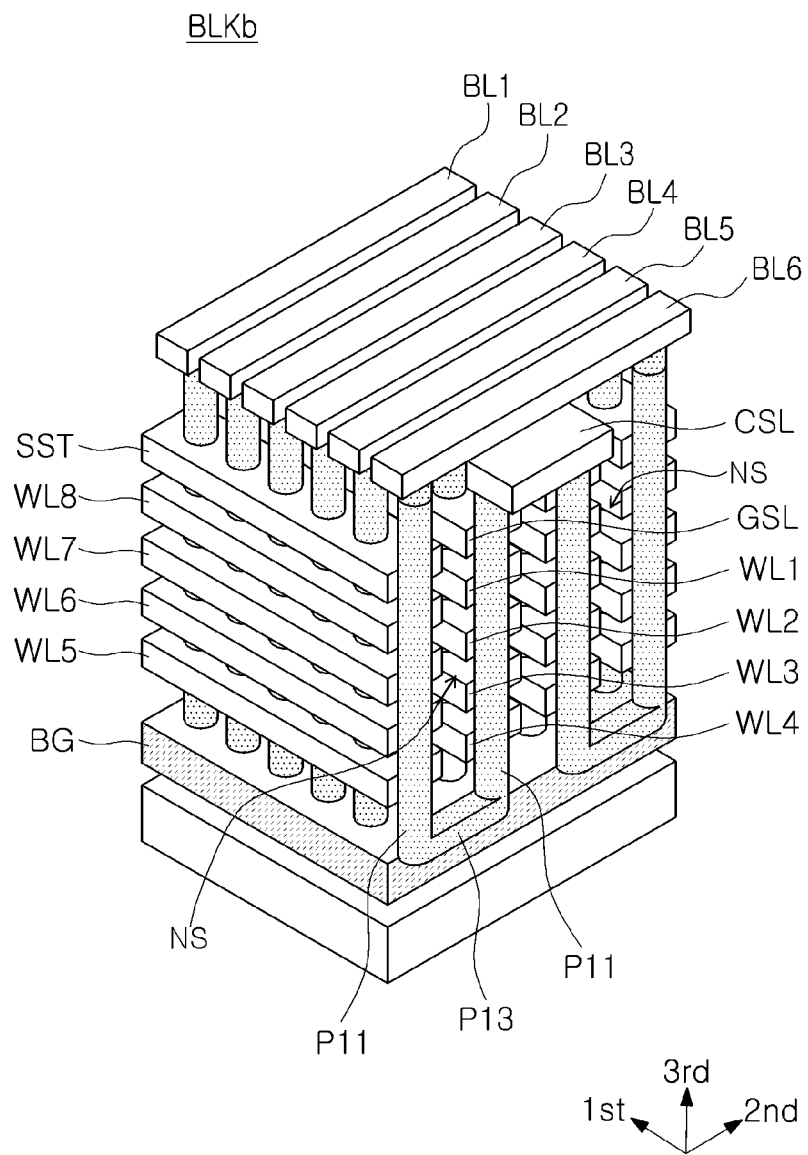

FIG. 2B is a diagram illustrating a memory block according to another embodiment. Referring to FIG. 2B, the number of wordlines of a memory block BLKb is 4, e.g., wordlines WL5 to WL8, for convenience of description.

Each string NS may include memory cells MC1 to MC8 connected in series. In this case, first upper ends of the memory cells MC1 to MC8 are connected to a string select transistor SST, second upper ends of the memory cells MC1 to MC8 are connected to a ground select transistor GST (not shown), and lower ends of the memory cells MC1 to MC8 may be pipe-connected. Memory cells constituting the string NS may be formed by being stacked on a plurality of semiconductor layers. Each string NS may include a first pillar PL11, a second pillar PL12 and a pillar connection portion PL13 connecting the first pillar PL11 and the second pillar PL12. The first pillar PL11 is connected to the bitline (for example, BL1) and the pillar connection portion PL13, and may be formed by passing through the string select transistor SST and between the wordlines WL5 to WL8. The second pillar PL12 is connected to a common source line CSL and the pillar connection portion PL13, and may be formed by passing through the ground select line GSL and between the wordlines WL1 to WL4. As illustrated in FIG. 2B, the string NS may be implemented in the form of a U-shaped pillar.

In an example embodiment, a back-gate BG may be formed on the substrate, and the pillar connection portion PL13 may be implemented in the back-gate BC. In an example embodiment, the back-gate BG may be present in common in the block BLKb. The back-gate BG may have a structure separated from a back-gate of another block.

Figure 3:
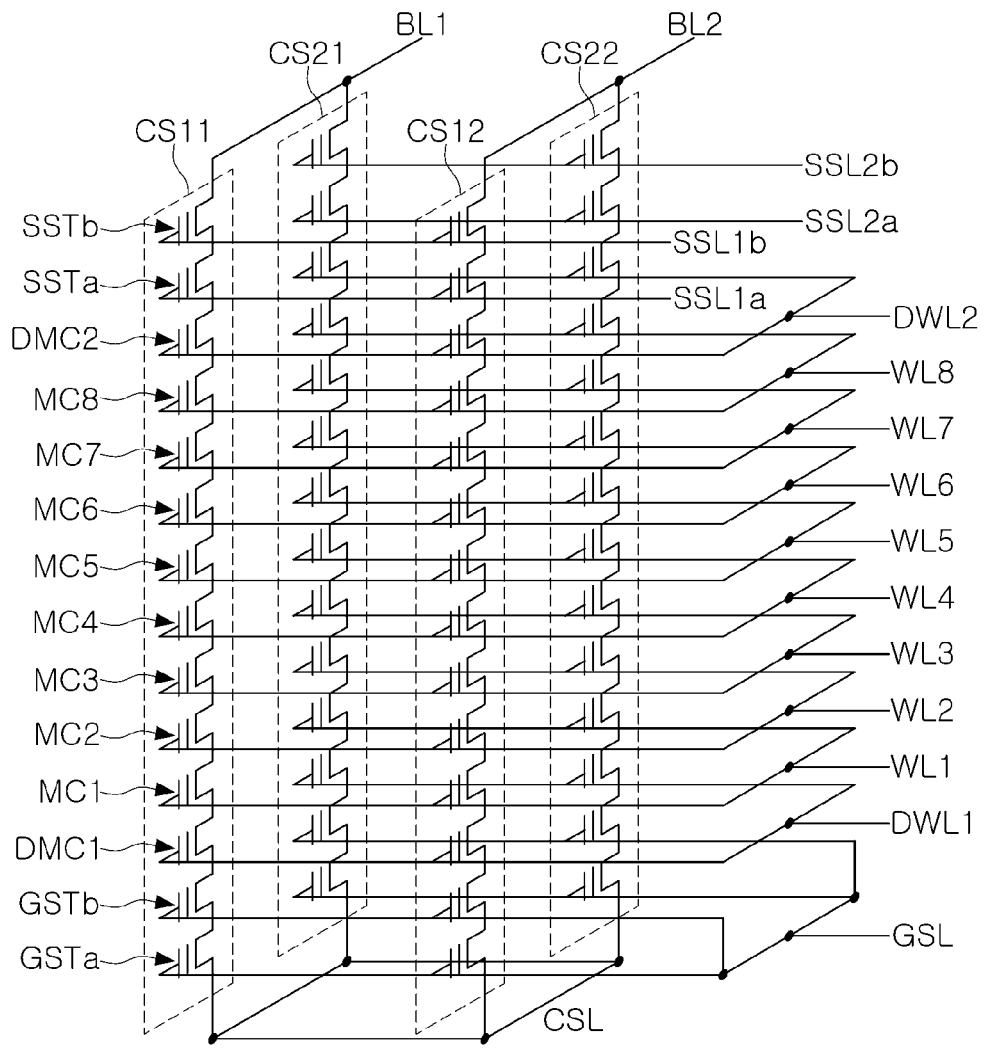
FIG. 3 is a diagram illustrating a circuit diagram of one memory block among memory blocks illustrated in FIG. 1 by way of example.
Figure 3:
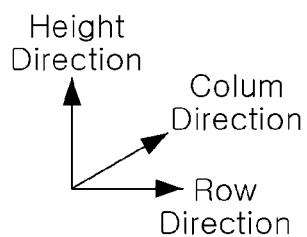

FIG. 3 is a diagram illustrating a circuit diagram of one memory block BLK1 among the memory blocks illustrated in FIG. 1 by way of example. Referring to FIG. 3, the memory block BLK1 having a 3D structure is illustrated. The memory block BLK1 may include a plurality of cell strings CS11, CS12, CS21 and CS22. The plurality of cell strings CS11, CS12, CS21 and CS22 may be disposed in a row direction and a column direction to form rows and columns.

In an example embodiment, the cell strings CS11 and CS12 may be connected to string select lines SSL1a and SSL1b to form a first row. The cell strings CS21 and CS22 may be connected to string select lines SSL2a and SSL2b to form a second row. For example, the cell strings CS11 and CS21 may be connected to the first bitline BL1 to form a first column. The cell strings CS12 and CS22 may be connected to the second bitline BL2 to form a second column.

Each of the plurality of cell strings CS11, CS12, CS21, and CS22 may include a plurality of cell transistors. For example, each of the plurality of cell strings CS11, CS12, CS21 and CS22 may include string select transistors SSTa and SSTb, a plurality of memory cells MC1 to MC8, ground select transistors GSTa and GSTb, and dummy memory cells DMC1 and DMC2. For example, each of the plurality of cell transistors included in the plurality of cell strings CS11, CS12, CS21 and CS22 may be a charge trap flash (CTF) memory cell.

The plurality of memory cells MC1 to MC8 are connected in series, and may be stacked in a height direction perpendicular to a plane formed by a row direction and a column direction. The string select transistors SSTa and SSTb are connected in series, and the series connected string select transistors SSTa and SSTb may be provided between the plurality of memory cells MC1 to MC8 and the bitline BL. The ground select transistors GSTa and GSTb are connected in series, and the series connected ground select transistors GSTa and GSTb may be provided between the plurality of memory cells MC1 to MC8 and the common source line CSL.

In an example embodiment, a first dummy memory cell DMC1 may be provided between the plurality of memory cells MC1 to MC8 and the ground select transistors GSTa and GSTb. For example, a second dummy memory cell DMC2 may be provided between the plurality of memory cells MC1 to MC8 and the string select transistors SSTa and SSTb.

The ground select transistors GSTa and GSTb of the cell strings CS11, CS12, CS21, and CS22 may be commonly connected to the ground select line GSL. For example, ground select transistors in the same row may be connected to the same ground select line, and ground select transistors in different rows may be connected to different ground select lines. For example, the first ground select transistors GSTa of the cell strings CS11 and CS12 of the first row may be connected to the first ground select line, and similarly, among the second string select transistors SSTb having the same height, string select transistors in the same row may be connected to the same string select line, and string select transistors in different rows may be connected to other string select lines. For example, the second string select transistors SSTb of the cell strings CS11 and CS12 of the first row are commonly connected to the string select line SSL1b, and the second string select transistors SSTb of the cell strings CS21 and CS22 of the second row may be commonly connected to the string select line SSL2b.

Although not illustrated, string select transistors of cell strings in the same row may be commonly connected to the same string select line. For example, the first and second string select transistors SSTa and SSTb of the cell strings CS11 and CS12 of the first row may be commonly connected to the same string select line. The first and second string select transistors SSTa and SSTb of the cell strings CS21 and CS22 of the second row may be commonly connected to the same string select line.

In an example embodiment, dummy memory cells having the same height may be connected to the same dummy wordline, and dummy memory cells having different heights may be connected to another dummy wordline. For example, the first dummy memory cells DMC1 may be connected to the first dummy wordline DWL1, and the second dummy memory cells DMC2 may be connected to the second dummy wordline DWL2.

In the first memory block BLK1, erasing may be performed in units of memory blocks or sub-blocks. When erasing is performed in units of memory blocks, all of the memory cells MC of the first memory block BLK1 may be simultaneously erased according to one erase request. When performed in units of sub-blocks, some of the memory cells MC of the first memory block BLK1 may be simultaneously erased according to an erase request, and others may be erase-prohibited. A low voltage (e.g., a ground voltage) is supplied to a wordline connected to the erased memory cells, and a wordline connected to the erase-prohibited memory cells may be floated.

It should be noted that the first memory block BLK1 illustrated in FIG. 3 is an example. The number of cell strings, the number of rows, the number of columns, the number of cell transistors GST, MC, DMC, SST, and the like, and the numbers of lines GSL, WL, DWL, SSL and the like connected to cell transistors depending on the numbers of the cell transistors are not limited to those illustrated in FIG. 3 and according to various example embodiments may each be varied.

Figure 4:
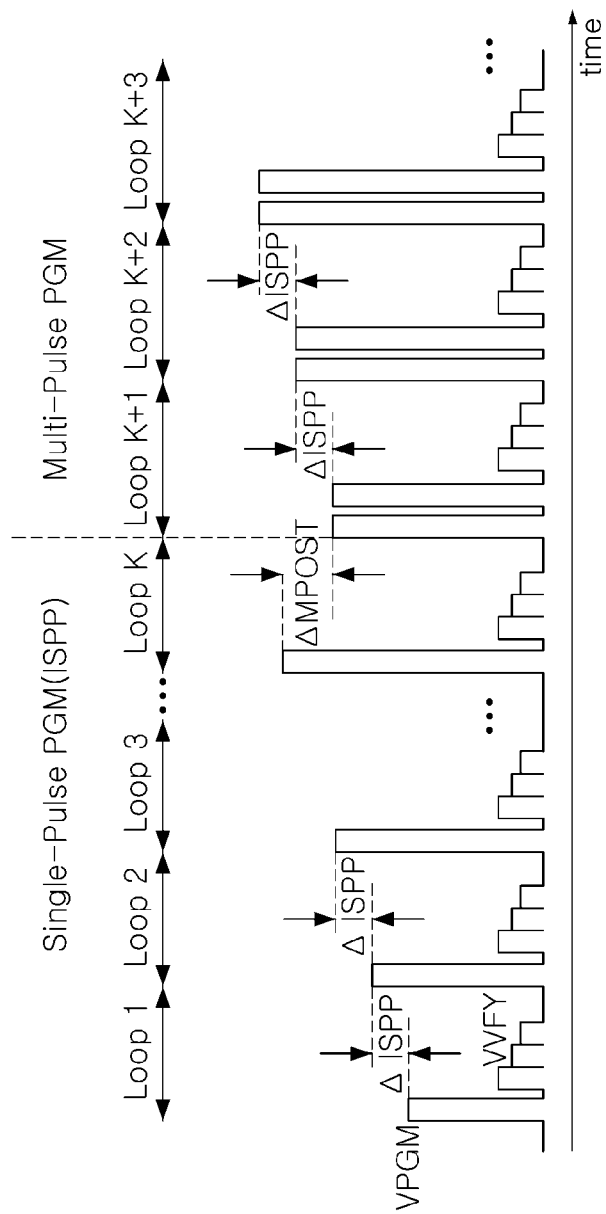
FIG. 4 is a diagram conceptually illustrating a program operation of a nonvolatile memory device according to an example embodiment.

FIG. 4 is a diagram conceptually illustrating a program operation of a nonvolatile memory device 100 according to an example embodiment. Referring to FIG. 4, a single-pulse program operation may be performed up to a Kth program loop (where K is an integer greater than or equal to 2), and a multi-pulse program operation may be performed from a K+1th program loop.

In the single-pulse program operation each loop may include a single program pulse (VPGM) and a plurality of verification pulses (VVFY). The single-pulse program operation may generally include incremental operation pulse programming (ISPP). As the program loop increases from the first program loop to the K-th program loop, the programming voltage may include a program pulse (VPGM) increasing by a first offset (AISPP) and a plurality of verification pulses (VVFY) for verification. In FIG. 4, three verification pulses are illustrated in each loop for convenience of description. However, the number of verification pulses according to an example embodiment is not limited thereto and in some example embodiments the number of verification pulses may be more or less than that illustrated in FIG. 4.

According to various example embodiments, the single-pulse program operation is performed and, when a condition is satisfied in a given program loop, the multi-pulse program operation may proceed from the next program loop. For example, assuming the condition is satisfied in the K-th program loop, the multi-pulse operation may proceed from the K+1 program loop, as illustrated in FIG. 4.

The multi-pulse program operation may include a plurality of program pulses and a plurality of verification pulses in each loop. In an example embodiment, the plurality of program pulses in a loop may have the same voltage level. In another embodiment, the plurality of program pulses in a loop may have different voltage levels. In an example embodiment, the number of the plurality of program pulses in each loop may be two as illustrated in FIG. 3. However, this is only an example and the number of program pulses in the multi-pulse program operation according to an example embodiment is not limited thereto.

In the K+1 th program loop, the programming voltage may include a plurality of program pulses lowered by a second offset ΔMPOST from a level of the program voltage of the program pulse VPGM in the K-th loop and a plurality of verification pulses for verification. The widths of each of the program pulses are not particularly limited and may be varied according to various example embodiments. For example, in an example embodiment, a width (or time) of each of the plurality of program pulses in the multi-pulse program operation may be the same as a width (or time) of the each of the plurality of program pulse of the single-pulse program operation. In an example embodiment, the width (or time) of each of the plurality of program pulses in the multi-pulse program operation may be the same as the width of the program pulse of the K-th program loop in the single-pulse program operation. However, it should be understood that the width of the program pulse according to an example embodiment is not limited thereto. In some example embodiments, the width of each of the plurality of program pulses of the K+1-th program loop and later program loops may be narrower than the width of the program pulse of the K-th program loop. In other example embodiments, the width of each of the plurality of program pulses may be different from one another.

In an example embodiment, the second offset ΔMPOST may vary depending on the position of the wordline. In another example embodiment, the second offsets ΔMPOST may be the same regardless of the position of the wordline.

From the K+2th program loop, a plurality of program pulses having a voltage level increased by a first offset ΔISPP, than a voltage level of the program pulse of the previous program loop, and verification pulses, may be included.

In FIG. 4, from the K+2 th program loop, a plurality of program pulses having a voltage level increasing by a first offset ΔISPP are illustrated. However, example embodiments are not limited thereto. The increment of the voltage levels in the multi-pulse program operation may be a value different from the first offset (ΔISPP).

In an example embodiment, when a condition is satisfied, data of a multi-pulse flag may be changed. For example, when a condition is satisfied, the multi-pulse flag may indicate data '1.' On the other hand, when the condition is not satisfied, the multi-pulse flag may indicate data '0.' However, it should be understood that the correspondence between the data of the multi-pulse flag and the condition is not limited thereto.

Figure 5:
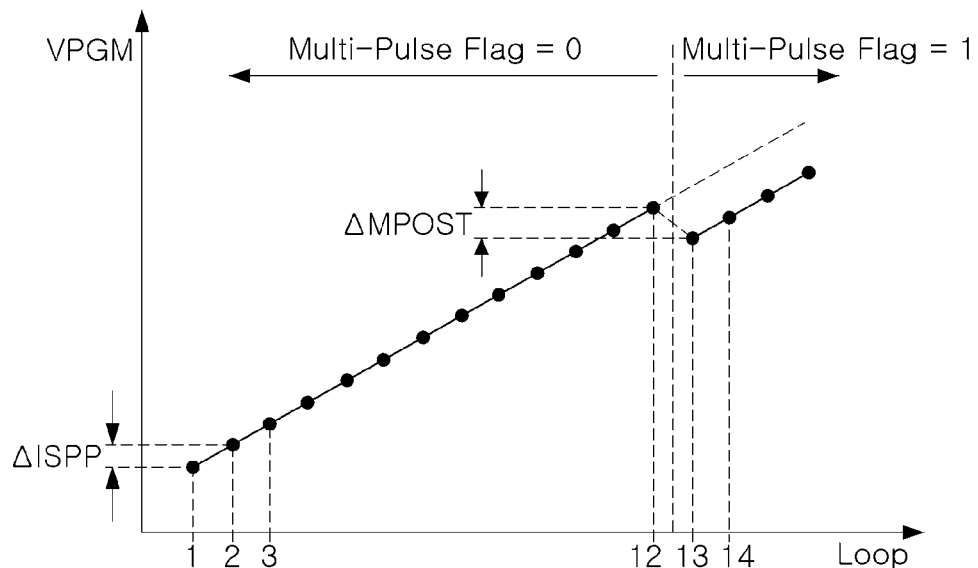
FIG. 5 is a diagram illustrating, as an example, a level of a program pulse when applying a multi-pulse program according to an example embodiment.

FIG. 5 is a diagram illustrating, as an example, a level of a program pulse when applying a multi-pulse program according to an example embodiment.

For convenience of explanation, there may be a case in which, from the first program loop to the 12th program loop, the multi-pulse flag is data '0' to correspond to the single-pulse program operation, and from the 13th program loop, the multi-pulse flag indicates data '1' to correspond to the multi-pulse program operation. Referring to FIG. 5, the program pulse VPGM is increased by a constant interval (ΔISPP) from the first program loop to the 12th program loop, and the program pulse VPGM is lowered by an interval (ΔMPOST) between the and 12nd and 13th program loops, and then, from the 14th program loop, the program pulse VPGM is increased again by the constant interval (ΔISPP). In some example embodiments, the constant interval (ΔISPP) in the single-pulse program operation may be different from the constant interval (ΔISPP) in the multi-pulse program operation. In other example embodiments, the constant interval (ΔISPP) in the single-pulse program operation may be the same as the constant interval (ΔISPP) in the multi-pulse program operation. In example embodiments, the interval (ΔMPOST) may be the same as or different than the constant interval (ΔISPP).

Figure 6:
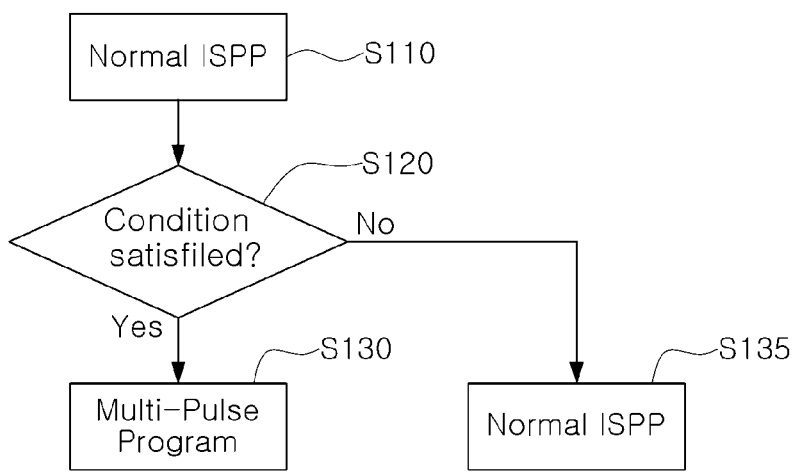
FIG. 6 is a flowchart illustrating a program operation of the nonvolatile memory device according to an example embodiment.

FIG. 6 is a flowchart illustrating a program operation of the nonvolatile memory device 100 according to an example embodiment. Referring to FIG. 6, as a program operation of the nonvolatile memory device 100, a normal ISPP operation (i.e., a single-pulse program operation) may be performed by default (S110). Thereafter, it may be determined whether a condition is satisfied. The condition may be predetermined. For example, the condition may indicate whether it is advantageous to apply a multi-pulse (S120). When it is determined to be advantageous to apply a multi-pulse (S120, Yes), a multi-pulse program operation may be performed (S130). On the other hand, when it is determined that it would not be advantageous to apply a multi-pulse (S120, No), a normal ISPP operation may be performed (S135). In an example embodiment, the program operation of FIG. 6 may be performed for each loop of the program operation.

In an example embodiment, the single-pulse program operation may include applying a first program pulse and applying a plurality of verification pulses VVFY, and the multi-pulse program operation may include applying a second program pulse, applying a third program pulse, and applying a plurality of verification pulses VVFY. In an example embodiment, each of the levels of the second and third program pulses may be lower than the level of the first program pulse.

In an example embodiment, when the condition is not satisfied, the level of the first program pulse is increased by the first offset (ΔISPP), and a single-pulse program operation may be performed using the increased first program pulse in the next program loop.

In an example embodiment, when the condition is satisfied, each of the second and third program pulses may have a level reduced by a second offset ΔMPOST from the level of the first program pulse.

In an example embodiment, the condition may be the number of program loops, and when the number of program loops is greater than a reference value, a multi-pulse program operation may be performed.

In an example embodiment, the condition may be whether a specific program state is passed, and when a specific program state is passed in a program loop, a multi-pulse program operation may be performed.

In an example embodiment, the condition may be the level of the program pulse, and when the level of the program pulse is equal to or higher than the multi-pulse program pulse detection level, the multi-pulse program operation may be performed. The multi-pulse program pulse detection level may be set experimentally or may be set in advance.

In an example embodiment, when applying the third program pulse in the multi-pulse program operation, an initial precharge operation may be performed on an unselected string to significantly increase a program disturbance.

In an example embodiment, in the multi-pulse program operation, the bitline recovery operation may not be performed after the second program pulse is applied, and the bitline recovery operation may be performed after the third program pulse is applied.

In an example embodiment, when a second program pulse is applied in a multi-pulse program operation, a voltage applied to the common source line may be maintained until a third program pulse is applied.

In an example embodiment, a first bitline setup time corresponding to the second program pulse in the multi-pulse program operation may be longer than a second bitline setup time corresponding to the third program pulse.

Figure 7A:
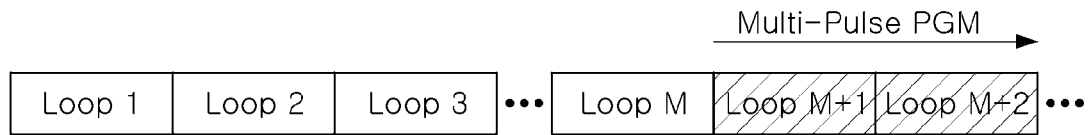
FIGS. 7A, 7B, and 7C are views illustrating, as examples, conditions.
Figure 7B:
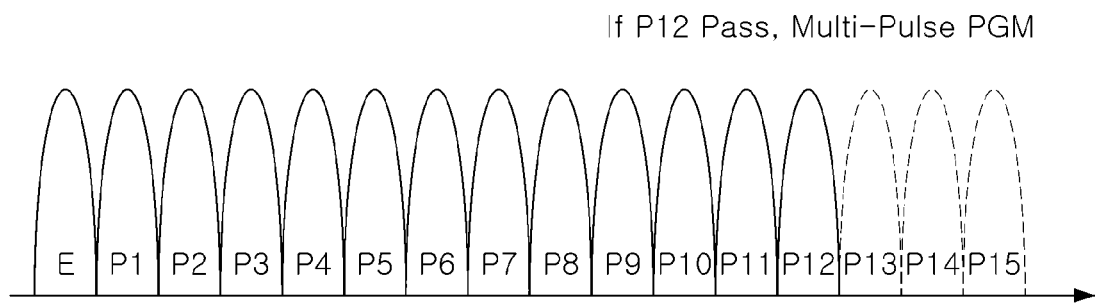
Figure 7C:
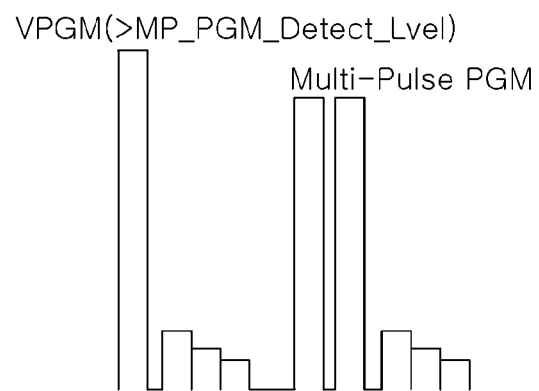

FIGS. 7A, 7B, and 7C are views of conditions in the program operation of FIG. 6, as examples.

Referring to FIG. 7A, the condition may be the number of program loops. For example, when the number of the program loop is greater than a value (M) (where M is an integer equal to or greater than 2), a multi-pulse program operation may be performed. The value (M) may be predetermined.

Referring to FIG. 7B, the condition may be whether a specific program state (e.g., P12) is passed. For example, when a twelfth program state P12 is passed, a multi-pulse program operation may be performed. In FIG. 7B, the specific program state is the twelfth program state P12 is provided by way of example. However, it should be understood that the specific program state according to an example embodiment is not limited thereto.

In addition, when determining whether a specific program state is passed, and when one of operated planes (or mats) is passed, the multi-pulse program operation may be performed.

Referring to FIG. 7C, the condition may be a detection level of a multi-pulse program pulse. The multi-pulse program pulse for which the detection level is taken as the condition may be predetermined. For example, when the program pulse VPGM is greater than a multi-pulse program pulse detection level MP_PGM_Detect_Level, a multi-pulse program operation may be performed. The multi-pulse program pulse detection level MP_PGM_Detect_Level may be predetermined.

The nonvolatile memory device 100 according to an example embodiment may perform a program operation using a multi-pulse flag indicating whether a condition is satisfied.

Figure 8:
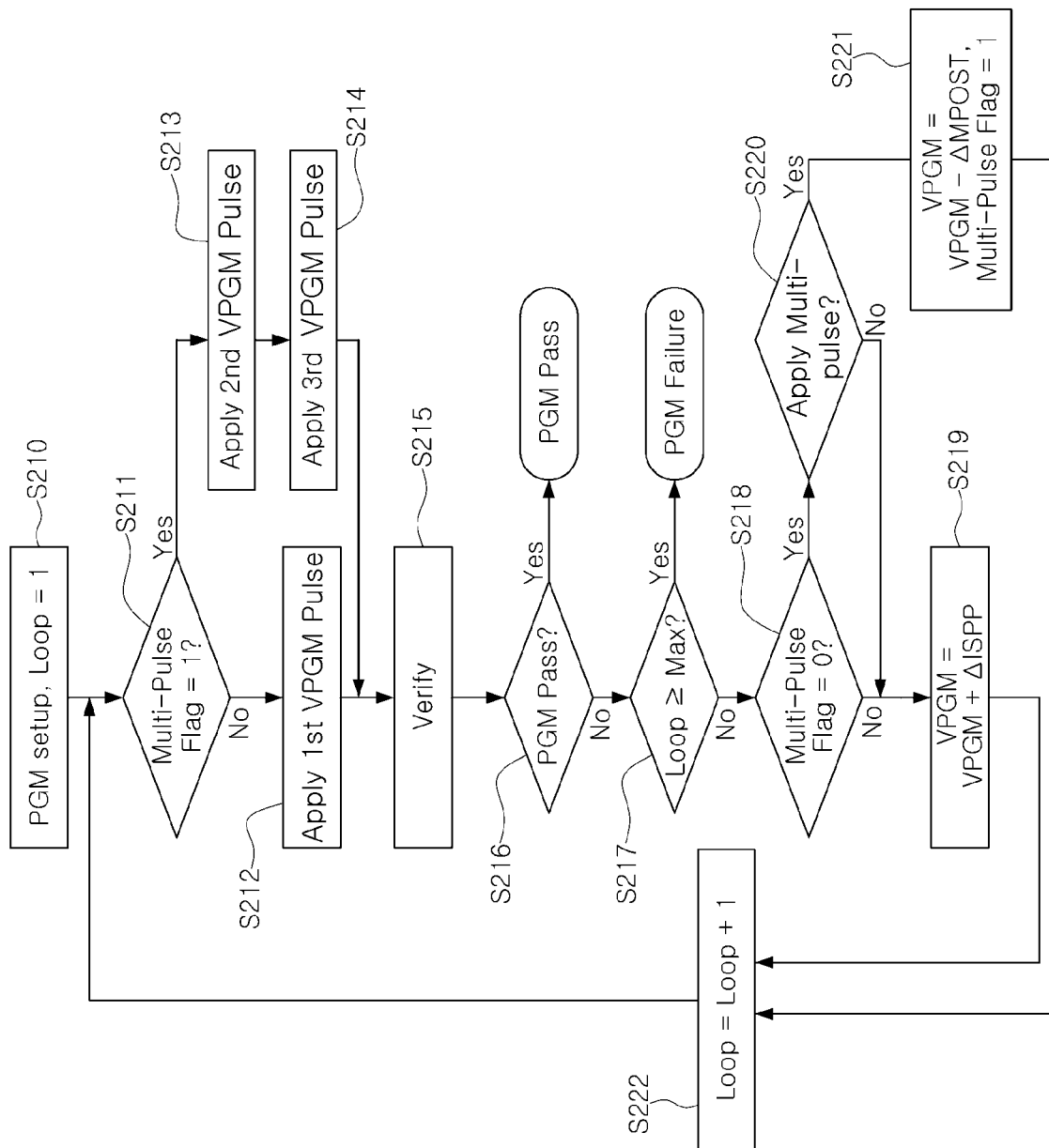
FIG. 8 is a flowchart illustrating a program operation of the nonvolatile memory device according to an example embodiment.

FIG. 8 is a flowchart illustrating a program operation of the nonvolatile memory device 100 according to an example embodiment. Referring to FIGS. 1 to 8, the program operation of the nonvolatile memory device 100 may be performed as follows. In the following, it is assumed that two program pulses are continuously applied in a multi-pulse program operation.

A program setup operation for receiving a program command and data from an external device and performing a program operation may be performed. The program setup operation may include an initial precharge operation for selected/unselected strings. In this case, the number of program loops may be set to 1 (S210). It may be determined whether the multi-pulse flag is data '1' (S211). When the multi-pulse flag does not indicate data '1' (S211, No), a first program pulse (1st VPGM Pulse) may be applied (S212). On the other hand, when the multi-pulse flag indicates data '1' (S211, Yes), a second program pulse (2nd VPGM Pulse) may be applied (S213), and then a third program pulse (3rd VPGM Pulse) may be applied (S214). In an example embodiment, the second program pulse (2nd VPGM Pulse) and the third program pulse (3rd VPGM Pulse) may be the same pulse. That is, for example, a voltage level of the second program pulse (2nd VPGM Pulse) may be the same voltage level as a voltage level of the third program pulse (3rd VPGM Pulse).

After operations S212 and S214 are performed, a verification operation for verifying a program may be performed (S215). In this case, the verification operation may use a single level pulse or a multi level pulse. Then, it may be determined whether the program operation PGM has been passed (S216). When the program operation is passed (S216, Yes), the program operation may be completed. On the other hand, when the program operation has not been passed (S216, No), it may be determined whether the number of program loops is greater than or equal to a maximum value Max (S217). When the number of program loops is greater than or equal to the maximum value Max (S217, Yes), the program operation may be processed as a failure.

On the other hand, when the number of program loops is not equal to or greater than the maximum value (Max) (S217, No), it may be determined whether the multi-pulse flag is data '0' (S218). When the multi-pulse flag is not data '0' (S218, No), the program pulse may be increased by the first offset ΔISPP (S219).

On the other hand, when the multi-pulse flag is data '0' (S218, Yes), it may be determined whether it is advantageous to apply the multi-pulse (S220). When it is determine not to be advantageous to apply the multi-pulse S220, No), operation S219 may be performed. On the other hand, when it is determined that it would be advantageous to apply the multi-pulse (S220, Yes), the program pulse VPGM is lowered by the second offset ΔMPOST, and the multi-pulse flag may be set to data '1' (S221). For example, it may be determined that it would be advantageous to apply the multi-pulse when a condition is satisfied.

After operation S219 or S221, the number of program loops is increased by 1 (S222), and the process returns to operation S211.

Figure 9A:
FIG. 9A is a diagram schematically illustrating an operation period of a multi-pulse program operation according to an example embodiment.

FIG. 9A is a diagram schematically illustrating an operation period of a multi-pulse program operation according to an example embodiment. Referring to FIG. 9A, the multi-pulse program operation may include a first bitline setup period (1st BL Setup), a first program execution period (1st PGM EXE), a second bitline setup period (2nd BL Setup), a second program execution period (2nd PGM EXE), a bitline recovery period (BL RCV), a Common Source Line (CSL) recovery period (CSL RCV), a verification period (VRF), and a verification pulse recovery period (VRF RCV).

In an example embodiment, after applying a pulse (e.g., 2nd PGM Pulse) other than the last pulse (e.g., 3rd PGM Pulse) to significantly reduce power consumption, the bitline recovery operation may not be performed.

Figure 9B:
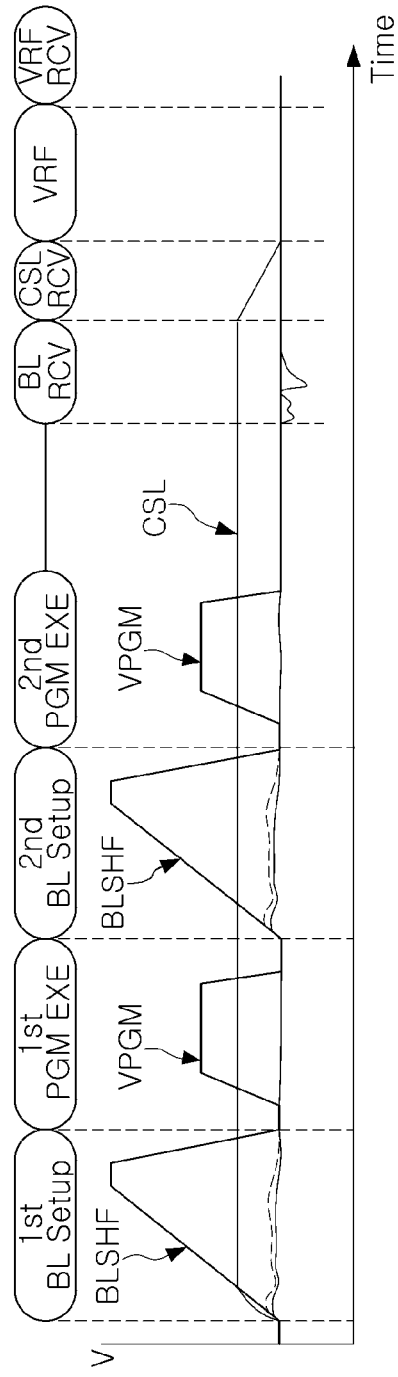
FIG. 9B is a diagram illustrating, as an example, a timing of a multi-pulse program operation according to an example embodiment.

FIG. 9B is a diagram illustrating a timing of a multi-pulse program operation according to an example embodiment. Referring to FIG. 9B, a voltage BLSHF for transmitting data corresponding to a bitline connected to a page buffer is applied in the first and second bitline setup periods (1st BL Setup and 2nd BL Setup), and a voltage VPGM for BL forcing may be applied to the first and second program execution periods (1st PGM EXE and 2nd PGM EXE), and a CSL voltage may be applied. The CSL voltage may be predetermined. After the bitline recovery period BL RCV, CSL may be reduced to the ground voltage. Thereafter, a verification operation may be performed.

In FIG. 9A, the first bitline setup period (1st BL Setup) and the second bitline setup period (2nd BL Setup) may be performed for the same amount of time, but are not limited thereto.

Figure 10:
FIG. 10 is a diagram illustrating an operation period of a multi-pulse program operation according to another example embodiment.

FIG. 10 is a diagram illustrating an operation period of a multi-pulse program operation according to another embodiment. Referring to FIG. 10, the time (T_BLSTP2) of the second bitline setup period (2nd BL Setup) may be shorter than the time (T_BLSTP1) of the first bitline setup period (1st BL Setup).

Figure 11A:
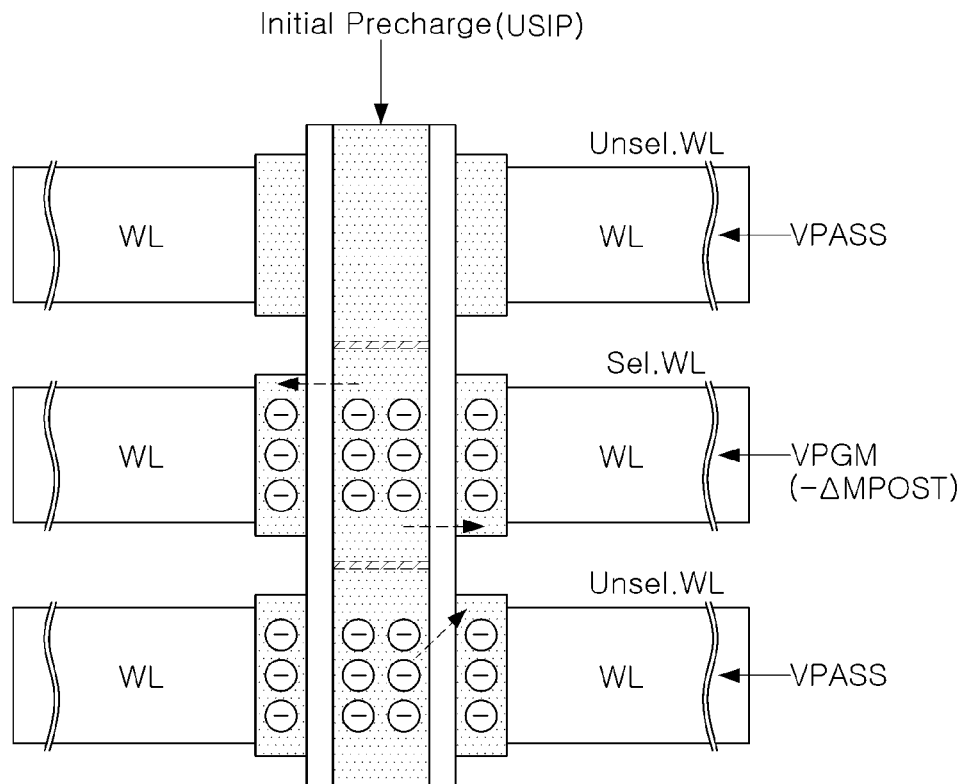
FIGS. 11A and 11B are views illustrating, as an example, an effect of reducing a program disturbance of the nonvolatile memory device according to an example embodiment.
Figure 11B:
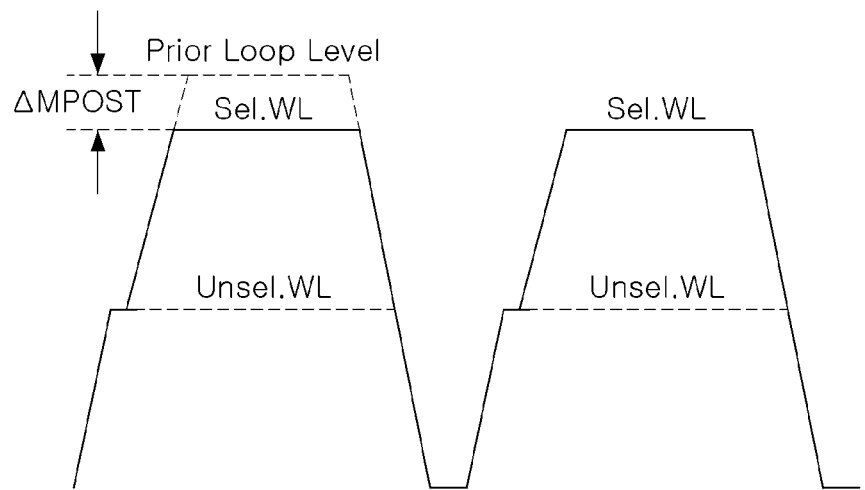

FIGS. 11A and 11B are views illustrating an effect of reducing a program disturbance of the nonvolatile memory device 100 according to an example embodiment. For convenience of explanation, it is assumed that among wordlines illustrated in FIG. 11A, a program operation is performed on a memory cell connected to a middle wordline, a program operation is completed for a memory cell connected to a lower wordline, and a program operation is not performed for a memory cell connected to the lower wordline.

In general, a program pulse VPGM is increased in the selected wordline during a program operation. Leakage is caused in channel boosting due to the increased program pulse VPGM, and thus data of a memory cell (a programmed cell, a non-programmed cell) connected to the unselected wordline may be destroyed. To this end, when a condition is satisfied, the nonvolatile memory device 100 may apply the program pulse VPGM, a multi-pulse lowered by the second offset ΔMPOST, to the selected wordline (Sel.WL). While performing a program operation on a memory cell connected to a selected wordline, leakage of a memory cell connected to an unselected wordline (Usel.WL) may be significantly reduced by a program pulse lowered by the second offset (ΔMPOST).

In an example embodiment, when a program pulse other than the first program pulse is applied to significantly increase the reduction in program disturbance in the multi-pulse program operation, an unselected string initial precharge (USIP) operation may be performed. In another embodiment, when a program pulse other than the first program pulse is applied in the multi-pulse program operation, the USIP operation may not be performed to improve performance.

The process may be performed in a separate processor for artificial intelligence to improve the reliability of the nonvolatile memory device according to an example embodiment.

Figure 12:
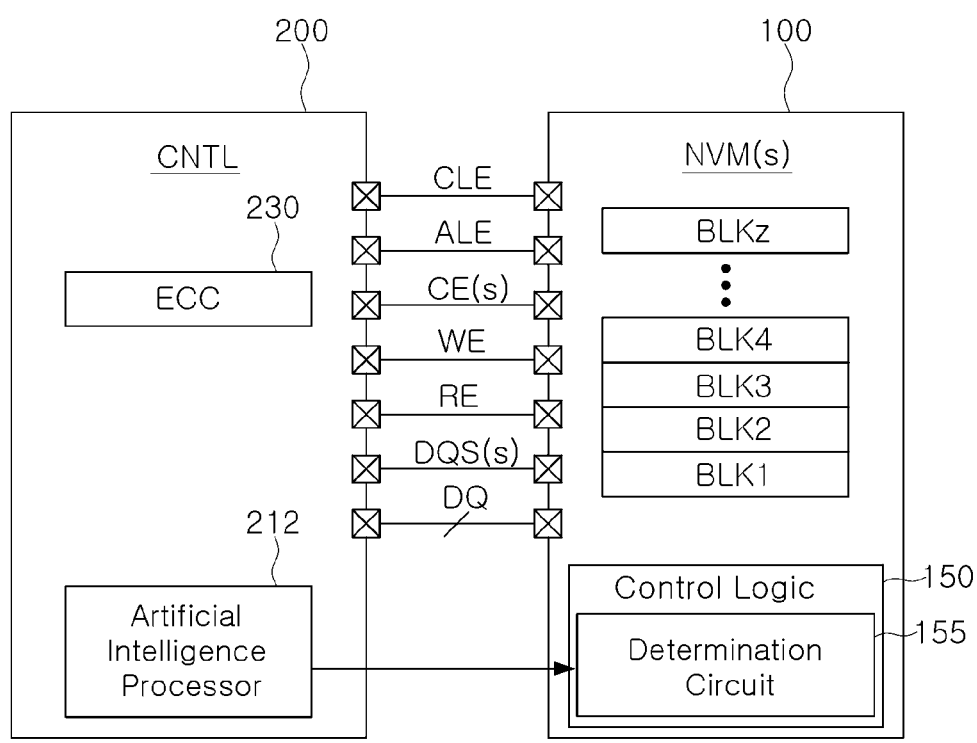
FIG. 12 is a diagram illustrating a storage device according to an example embodiment.

FIG. 12 is a diagram illustrating a storage device 10 according to an example embodiment. Referring to FIG. 12, the storage device 10 may include at least one nonvolatile memory device NVM 100, and a controller CNTL 200 controlling the nonvolatile memory device 100. In FIG. 12, like reference numbers are used for like components and repeated description thereof is omitted for conciseness.

The at least one nonvolatile memory device NVM 100 may be implemented to perform a multi-pulse program operation capable of improving performance while reducing a program disturbance as described with reference to FIGS. 1 to 11.

A controller CNTL 200 may be connected to at least one nonvolatile memory device NVM 100 through a plurality of control pins that transmit control signals, for example, a command latch enable CLE, an address latch enable ALE, chip enable(s) CE(s), a write enable WE, a read enable RE, and the like, and in addition, may be implemented to control the nonvolatile memory device 100, using the control signals CLE, ALE, CE(s), WE, and RE. For example, the nonvolatile memory device 100 may perform a program operation/reading operation/erase operation by latching a command or an address at the edge of the write enable (WE) signal in response to the command latch enable (CLE) signal and the address latch enable (ALE) signal.

The controller 200 may be implemented to control the overall operation of the storage device 10. The controller 200 may perform various management operations, such as cache/buffer management, firmware management, garbage collection management, wear leveling management, data redundancy removal management, read refresh/reclaim management, bad block management, multi-stream management, mapping management of host data and nonvolatile memory, quality of service (QoS) management, system resource allocation management, non-volatile memory queue management, read voltage level management, erase/program management, hot/cold data management, power loss protection management, dynamic thermal management, initialization management, redundant array of inexpensive disk (RAID) management, and the like.

In addition, the controller 200 may include an artificial intelligence processor 212 and an error correction circuit (ECC) 230. The artificial intelligence processor 212 may manage reliability improvement of the nonvolatile memory device 100 using artificial intelligence.

The ECC circuit 230 may be implemented to generate an error correction code during a program operation and to recover data using an error correction code during a reading operation. For example, the ECC circuit 230 may generate an error correction code for correcting a fail bit or an error bit of data received from the nonvolatile memory device 100. The ECC circuit 230 may perform error correction encoding of data provided to the nonvolatile memory device 100 to form data to which a parity bit is added. The parity bit may be stored in the nonvolatile memory device 100. In addition, the ECC circuit 230 may perform error correction decoding on data output from the nonvolatile memory device 100. The ECC circuit 230 may correct an error, using parity. The ECC circuit 230 may correct the error, using coded modulation such as low density parity check (LDPC) code, BCH code, turbo code, Reed-Solomon code, convolution code, recursive systematic code (RSC), trellis-coded modulation (TCM), block coded modulation (BCM), or the like.

Figure 13:
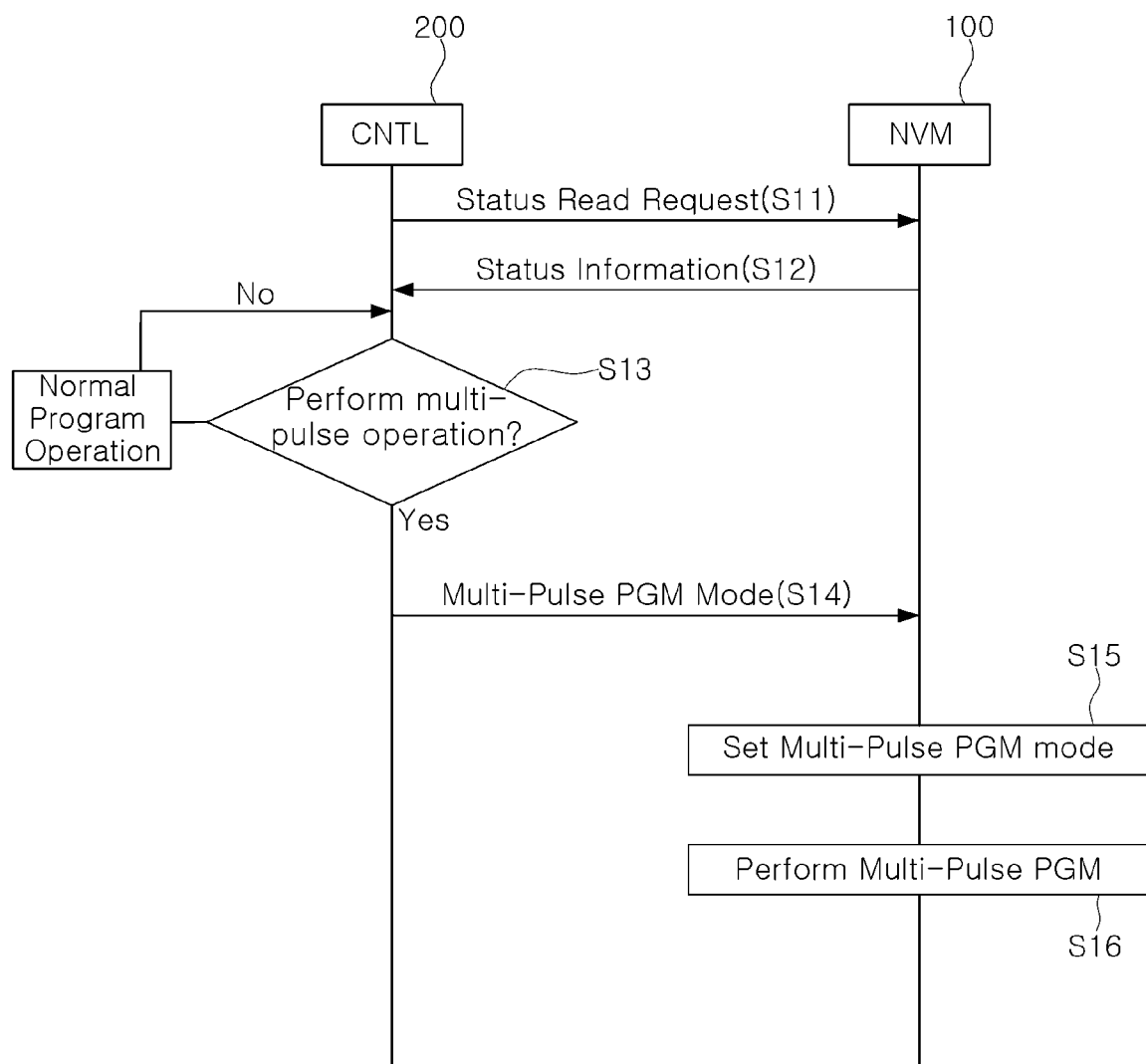
FIG. 13 is a ladder diagram illustrating a process of performing a multi-pulse program operation in a storage device according to an example embodiment.

FIG. 13 is a ladder diagram illustrating a process of performing a multi-pulse program operation in a storage device according to an example embodiment. Referring to FIGS. 1 to 13, the operation of the storage device 10 (see FIG. 12) may proceed as follows. The process may be performed by the controller CNTL 200 and the at least one nonvolatile memory device NVM 100.

The controller CNTL may transmit a status read request to a nonvolatile memory device NVM (S11). The nonvolatile memory device NVM may output the status information to the controller CNTL in response to a status read request (S12). In this case, the status information may include cell count information indicating reliability of the memory cell.

In this case, the controller CNTL may determine whether it is advantageous to perform a multi-pulse program operation in the program operation based on the status information (S13). When a multi-pulse program operation is not required (S13, No), a normal program operation may be performed (S17).

On the other hand, when it is determined that it would be advantageous to perform a multi-pulse program operation (S13, Yes), the controller CNTL may transmit the multi-pulse program mode information to the nonvolatile memory device NVM (S14). The nonvolatile memory device NVM may receive multi-pulse program mode information and set a multi-pulse program mode (S15). Thereafter, the nonvolatile memory device NVM may perform a multi-pulse program operation when a condition is satisfied (S16). The condition may be predetermined.

In some example embodiments, the nonvolatile memory device according to an example embodiment may be implemented in a chip to chip (C2C) structure.

Figure 14:
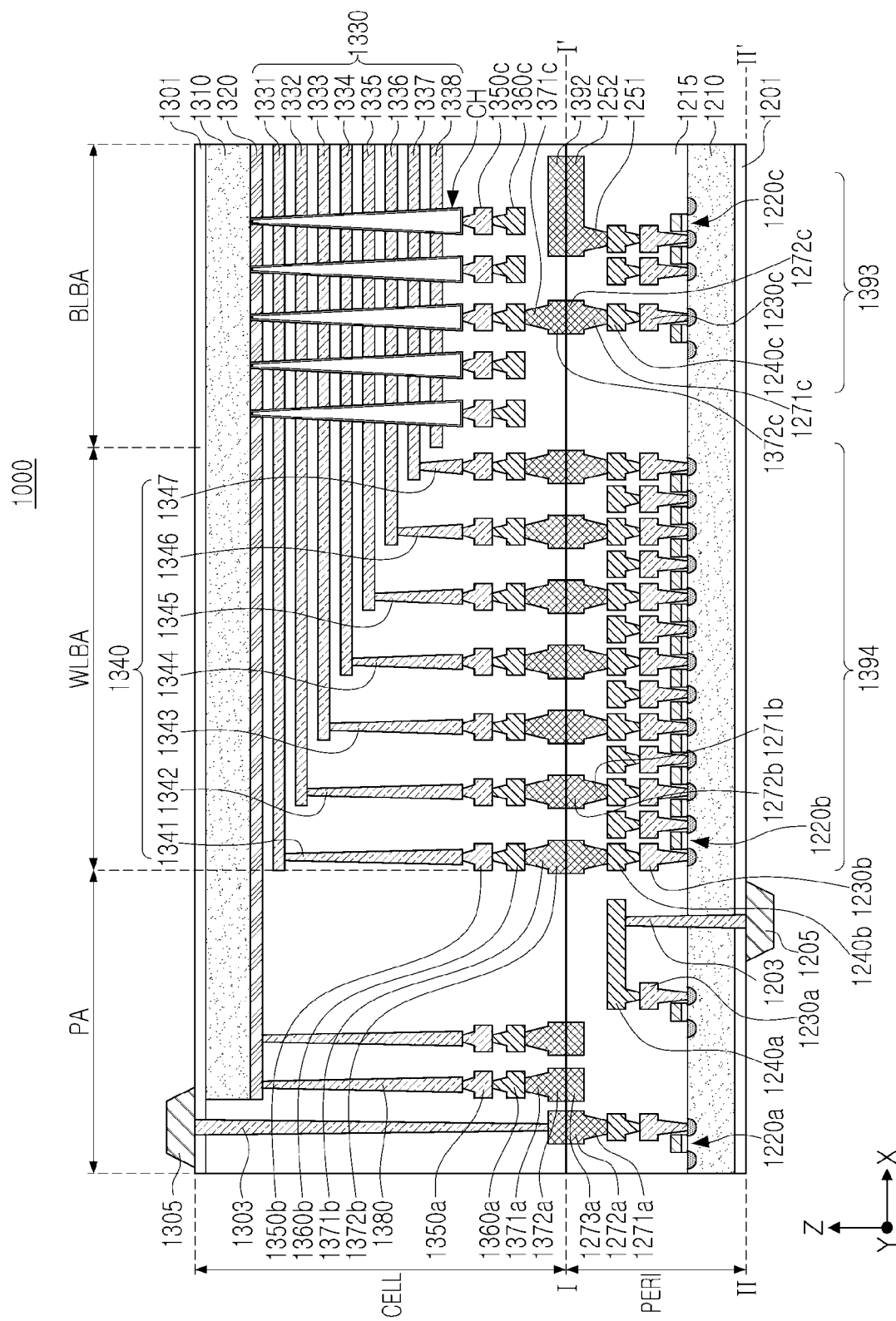
FIG. 14 is a diagram illustrating a nonvolatile memory device implemented in a chip to chip (C2C) structure according to an example embodiment.

FIG. 14 is a diagram illustrating a nonvolatile memory device 1000 implemented in a chip to chip (C2C) structure according to an example embodiment. In this case, the C2C structure may be formed by fabricating an upper chip including a cell area (CELL) on a first wafer, fabricating a lower chip including a peripheral circuit area (PERI) on a second wafer different from the first wafer, and then connecting the upper chip and the lower chip to each other by a bonding method. For example, the bonding method may be a method of electrically connecting a bonding metal formed on an uppermost metal layer of an upper chip and a bonding metal formed on an uppermost metal layer of a lower chip. In an example embodiment, when the bonding metal is formed of copper (Cu), the bonding method may be a Cu-to-Cu bonding method. In another example embodiment, the bonding metal may be formed of aluminum (Al) or tungsten (W).

Each of a peripheral circuit area PERI and a cell area CELL of the nonvolatile memory device 1000 may include an external pad bonding area PA, a wordline bonding area WLBA, and a bitline bonding area BLBA.

The peripheral circuit area PERI may include a first substrate 1210, an interlayer insulation layer 1215, a plurality of circuit elements 1220a, 1220b and 1220c formed on the first substrate 1210, first metal layers 1230a, 1230b and 1230c connected to the plurality of circuit elements 1220a, 1220b and 1220c, respectively, and second metal layers 1240a, 1240b and 1240c formed on the first metal layers 1230a, 1230b and 1230c. In an example embodiment, the first metal layers 1230a, 1230b, and 1230c may be formed of tungsten having a relatively high specific resistance. In an example embodiment, the second metal layers 1240a, 1240b, and 1240c may be formed of copper having a relatively low specific resistance.

As illustrated in FIG. 14, the first metal layers 1230a, 1230b, and 1230c and the second metal layers 1240a, 1240b, and 1240c are illustrated, but the present inventive concept will not be limited thereto. At least one metal layer may be further formed on the second metal layers 1240a, 1240b, and 1240c. At least a portion of the one or more metal layers formed on the second metal layers 1240a, 1240b, and 1240c may be formed of aluminum having a resistivity different from that of copper forming the second metal layers 1240a, 1240b, and 1240c.

In an example embodiment, the interlayer insulation layer 1215 may be disposed on the first substrate 1210 to cover a plurality of circuit elements 1220a, 1220b and 1220c, first metal layers 1230a, 1230b and 1230c, and second metal layers 1240a, 1240b and 1240c. In an example embodiment, the interlayer insulation layer 1215 may include an insulating material such as silicon oxide or silicon nitride.

Lower bonding metals 1271*b* and 1272*b* may be formed on the second metal layer 1240*b* of the wordline bonding region WLBA. In the wordline bonding area WLBA, the lower bonding metals 1271*b* and 1272*b* of the peripheral circuit area PERI may be electrically connected to the upper bonding metals 1371*b* and 1372*b* of the cell area CELL by a bonding method. In an example embodiment, the lower bonding metals 1271*b* and 1272*b* and the upper bonding metals 1371*b* and 1372*b* may be formed of aluminum, copper, or tungsten. In addition, the upper bonding metals 1371*b* and 1372*b* of the cell area CELL may be referred to as first metal pads, and the lower bonding metals 1271*b* and 1272*b* may be referred to as second metal pads.

The cell area CELL may include at least one memory block. In an example embodiment, the cell area CELL may include the second substrate 1310 and the common source line 1320. On the second substrate 1310, a plurality of wordlines 1331-338 and 330 may be stacked in a direction (Z-axis direction) perpendicular to an upper surface of the second substrate 1310. In an example embodiment, string select lines and ground select lines may be disposed on each of the upper and lower portions of the wordlines 1330. In an example embodiment, a plurality of wordlines 1330 may be disposed between the string select lines and the ground select line.

In the bitline bonding region BLBA, the channel structure CH extends in a direction (Z-axis direction) perpendicular to the upper surface of the second substrate 1310 and may penetrate through wordlines 1330, string select lines, and a ground select line. The channel structure CH may include a data storage layer, a channel layer, and a buried insulation layer, and the channel layer may be electrically connected to the first metal layer 1350*c* and the second metal layer 1360*c*. For example, the first metal layer 1350*c* may be a bitline contact, and the second metal layer 1360*c* may be a bitline. In an example embodiment, the bitline 1360*c* may extend along a first direction (Y-axis direction) parallel to the upper surface of the second substrate 1310.

As illustrated in FIG. 14, a region in which the channel structure CH and the bitline 1360*c* are disposed may be defined as the bitline bonding region BLBA. In an example embodiment, the bitline 1360*c* may be electrically connected to the circuit elements 1220*c* providing the page buffer 1393 in the peripheral circuit area PERI in the bitline bonding area BLBA. For example, the bitline 1360*c* may be connected to the upper bonding metals 1371*c* and 1372*c* in the peripheral circuit area PERI. In this case, the upper bonding metals 1371*c* and 1372*c* may be connected to the lower bonding metals 1271*c* and 1272*c* connected to the circuit elements 1220*c* of the page buffer 1393. In the wordline bonding area WLBA, the wordlines 1330 may extend along a second direction (X-axis direction) perpendicular to the first direction and parallel to the top surface of the second substrate 1310. In an example embodiment, the wordline bonding area WLBA may be connected to the plurality of cell contact plugs 1341 to 1347(1340). For example, the wordlines 1330 and the cell contact plugs 1340 may be connected to each other by pads provided by extending at least some of the wordlines 1330 to different lengths along the second direction. In an example embodiment, the first metal layer 1350*b* and the second metal layer 1360*b* may be sequentially connected to the cell contact plugs 1340 connected to the wordlines 1330. In an example embodiment, the cell contact plugs 1340 may be connected to the peripheral circuit area PERI through upper bonding metals 1371*b* and 1372*b* of the cell area CELL and the lower bonding metal 1271*b* and 1272*b* of the peripheral circuit area PERI, in the wordline bonding area WLBA.

In an example embodiment, the cell contact plugs 1340 may be electrically connected to the circuit elements 1220*b* providing the row decoder 1394 in the peripheral circuit area PERI. In an example embodiment, operating voltages of the circuit elements 1220*b* providing the row decoder 1394 may be different from the operating voltages of the circuit elements 1220*c* providing the page buffer 1393. For example, the operating voltage of the circuit elements 1220*c* providing the page buffer 1393 may be greater than the operating voltage of the circuit elements 1220*b* providing the row decoder 1394.

A common source line contact plug 1380 may be disposed in the external pad bonding area PA. In an example embodiment, the common source line contact plug 1380 may be formed of a conductive material such as a metal, a metal compound, or polysilicon. The common source line contact plug 1380 may be electrically connected to the common source line 1320. A first metal layer 1350*a* and a second metal layer 1360*a* may be sequentially stacked on the common source line contact plug 1380. For example, an area in which the common source line contact plug 1380, the first metal layer 1350*a*, and the second metal layer 1360*a* are disposed may be defined as an external pad bonding area PA. The second metal layer 1360*a* may be electrically connected to the upper metal via 1371*a*. The upper metal via 1371*a* may be electrically connected to the upper metal pattern 1372*a*.

Input/output pads 1205 and 1305 may be disposed in the external pad bonding area PA. Referring to FIG. 14, a lower insulation layer 1201 covering a lower surface of the first substrate 1210 may be formed under the first substrate 1210. Also, a first input/output pad 1205 may be formed on the lower insulation layer 1201. In an example embodiment, the first input/output pad 1205 may be connected to at least one of a plurality of circuit elements 1220*a*, 1220*b*, and 1220*c* disposed in the peripheral circuit area PERI through the first input/output contact plug 1203. In an example embodiment, the first input/output pad 1205 may be separated from the first substrate 1210 by the lower insulation layer 1201. In addition, since a side insulation layer is disposed between the first input/output contact plug 1203 and the first substrate 1210, the first input/output contact plug 1203 and the first substrate 1210 may be electrically separated.

Referring to FIG. 14, an upper insulation layer 1301 may be formed on the second substrate 1310 to cover the upper surface of the second substrate 1310. Also, a second input/output pad 1305 may be disposed on the upper insulation layer 1301. In an example embodiment, the second input/output pad 1305 may be connected to at least one of the plurality of circuit elements 1220*a*, 1220*b*, and 1220*c* disposed in the peripheral circuit area PERI through the second input/output contact plug 1303, the lower metal pattern 1272*a*, and the lower metal via 1271*a*.

In an example embodiment, the second substrate 1310 and the common source line 1320 may not be disposed in a region where the second input/output contact plug 1303 is disposed. Also, the second input/output pad 1305 may not overlap the wordlines 1380 in the third direction (Z-axis direction). Referring to FIG. 14, the second input/output contact plug 1303 may be separated from the second substrate 1310 in a direction parallel to the upper surface of the second substrate 1310. In addition, the second input/output contact plug 1303 may pass through the interlayer insulation layer 1315 of the cell area CELL and may be connected to the second input/output pad 1305. In an example embodiment, the second input/output pad 1305 may be electrically connected to the circuit element 1220*a*.

In an example embodiment, the first input/output pad 1205 and the second input/output pad 1305 may be selectively formed. For example, the nonvolatile memory device 1000 may include only a first input/output pad 1205 disposed on the first substrate 1201 or may include only a second input/output pad 1305 disposed on the second substrate 1301. In another example embodiment, the nonvolatile memory device 1000 may include both a first input/output pad 1205 and a second input/output pad 1305.

The metal pattern of an uppermost metal layer is present as a dummy pattern in each of the outer pad bonding area PA and the bitline bonding area BLBA included in each of the cell area CELL and the peripheral circuit area PERI, or the uppermost metal layer may be empty.

In the nonvolatile memory device 1000 according to an example embodiment, in the external pad bonding area PA, a lower metal pattern 1273*a* having the same shape as the upper metal pattern 1372*a* of the cell area CELL may be formed on the uppermost metal layer of the peripheral circuit area PERI, to correspond to the upper metal pattern 1372*a* formed on the uppermost metal layer of the cell area (CELL). The lower metal pattern 1273*a* formed on the uppermost metal layer of the peripheral circuit area PERI may not be connected to a separate contact in the peripheral circuit area PERI. Similarly, an upper metal pattern having the same shape as the lower metal pattern of the peripheral circuit area PERI may be formed on the upper metal layer of the cell area CELL, to correspond to the lower metal pattern formed on the uppermost metal layer of the peripheral circuit area PERI in the outer pad bonding area PA.

Lower bonding metals 1271*b* and 1272*b* may be formed on the second metal layer 1240*b* of the wordline bonding region WLBA. In an example embodiment, the lower bonding metals 1271*b* and 1272*b* of the peripheral circuit area PERI in the wordline bonding area WLBA may be electrically connected to the upper bonding metals 1371*b* and 1372*b* of the cell area CELL by a bonding method.

In addition, in the bitline bonding region BLBA, an upper metal pattern 1392 having the same shape as the lower metal pattern 1252 of the peripheral circuit area PERI may be formed on the uppermost metal layer of the cell area CELL, to correspond to the lower metal pattern 1252 formed on the uppermost metal layer of the peripheral circuit area (PERI). In this case, the lower metal pattern 1252 may be electrically connected to the lower metal via 1251. A contact may not be formed on the upper metal pattern 1392 formed on the uppermost metal layer of the cell area CELL.

The nonvolatile memory device and a programming method thereof according to an example embodiment may reduce program disturbance by lowering the programming voltage and may significantly reduce performance degradation.

In the program operation using the ISPP method, the initial loop receives relatively little Program Disturbance because the VPGM voltage is low. Therefore, single pulse is used up to the loop that satisfies a specific condition and multi-pulse is applied after that. When multi-pulse is applied, the amount of pulses programmed at the same voltage is increased compared to single pulse. Therefore, when programming by applying the same ISPP step, the amount of Vth increase of the cell increases, which may deteriorate the program distribution. To compensate for this, it is possible to compensate by lowering the programming voltage (VPGM) as much as the program speed accelerated by Multi-Pulse.

In the program operation using the ISPP method, the initial loop receives relatively little Program Disturbance because the VPGM voltage is low. Therefore, single pulse is used up to the loop that satisfies a specific condition and multi-pulse is applied after that. When multi-pulse is applied, the amount of programmed at the same voltage is increased compared to single pulse. Therefore, when programming by applying the same ISPP step, the amount of Vth increase of the cell increases, which may deteriorate the program distribution. To compensate for this, it is possible to compensate by lowering the programming voltage (VPGM) as much as the program speed accelerated by Multi-Pulse.

Specific conditions for changing to Multi-Pulse may be determined by (i) whether the current loop is greater than a specific loop value, (ii) whether a specific state has passed, and (iii) whether the current programming voltage is higher than a specific voltage. In this case, a specific loop and a specific programming voltage may differ according to the WL. In addition, the method of determining whether a specific state is passed may be applied to Multi-Pulse when even one of the planes (or mats) in operation is passed.

The value of lowering the programming voltage VPGM when multi-pulse is applied may vary depending on the WL. When performing Multi-Pulse, the Unselected String Initial Precharge (USIP) operation in a pulse other than the 1st pulse may be performed to significantly reduce disturbance or may not be performed to significantly increase performance. When performing Multi-Pulse, in the pulse other than the last pulse, the BL recovery operation after applying the pulse is not performed, thereby significantly reducing the increase in power. When performing Multi-Pulse, the power increase may be significantly reduced by maintaining the CSL voltage applied to the 1st pulse without recovering until the end of the last pulse. When performing Multi-Pulse, in the pulse other than the 1st pulse, the time of setting the BL to determine the program and inhibit is applied shortly to significantly reduce performance degradation.

As set forth above, in a nonvolatile memory device, a programming method thereof, and a storage device including the same according to various example embodiments, program disturbance may be reduced by performing a multi-pulse program operation.

In a nonvolatile memory device, a programming method thereof, and a storage device including the same according to various example embodiments, reliability improvement may be expected by performing a multi-pulse program operation when a specific condition is satisfied while performing a single pulse program operation.

While example embodiments have been illustrated and described above, it will be apparent to those skilled in the art that modifications and variations could be made without departing from the scope defined by the appended claims.

What is claimed is:

1. A nonvolatile memory device comprising:
a memory cell area having a first metal pad;
a peripheral circuit area having a second metal pad and vertically connected through the first metal pad and the second metal pad,
a memory cell array, in the memory cell area, the memory cell array including a plurality of memory blocks having a plurality of memory cells connected to a plurality of wordlines and a plurality of bitlines;

a row decoder in the peripheral circuit area, the row decoder configured to select one of the plurality of wordlines;
a page buffer circuit, in the peripheral circuit area, the page buffer circuit having a plurality of page buffers connected to the plurality of bitlines; and
a control logic configured to control the row decoder and the page buffer circuit,
wherein the control logic includes a determination circuit configured to determine whether to perform one of a single-pulse program operation and a multi-pulse program operation according to a program condition,
wherein the single-pulse program operation includes applying a first program pulse and applying a plurality of verification pulses,
the multi-pulse program operation includes applying a second program pulse, applying a third program pulse after the second program pulse, followed by applying a plurality of verification pulses, and
each of the second program pulse and the third program pulse has a level lower than a level of the first program pulse.

2. The nonvolatile memory device of claim 1, wherein the program condition includes at least one of a number of program loops and a level of a program pulse.

3. The nonvolatile memory device of claim 1, wherein the program condition includes pass/fail information of a specific program state.

4. The nonvolatile memory device of claim 1, wherein the program condition includes data stored in a predetermined register.

5. The nonvolatile memory device of claim 1, wherein the program condition is whether a program state is passed, and wherein the control logic determines whether the program condition is satisfied by determining whether the program state is passed in a program loop.

6. The nonvolatile memory device of claim 1, wherein when applying the third program pulse in the multi-pulse program operation, an initial precharge operation is performed on an unselected string.

7. The nonvolatile memory device of claim 1, wherein in the multi-pulse program operation, a bitline recovery operation is not performed after the second program pulse is applied, and the bitline recovery operation is performed after the third program pulse is applied.

8. The nonvolatile memory device of claim 1, wherein when the second program pulse is applied in the multi-pulse program operation, a voltage applied to a common source line is maintained until the third program pulse is applied.

9. The nonvolatile memory device of claim 1, wherein in the multi-pulse program operation, a first bitline setup time corresponding to the second program pulse is longer than a second bitline setup time corresponding to the third program pulse.

10. The nonvolatile memory device of claim 1, wherein applying the plurality of verification pulses includes applying verification pulses in sequence, starting from high-level pulse proceeding to lower level pulses.

11. A storage device comprising:
at least one nonvolatile memory device; and
a controller configured to control the at least one nonvolatile memory device,
wherein the at least one nonvolatile memory device includes:
a memory cell area having a first metal pad; and
a peripheral circuit area having a second metal pad and vertically connected through the first metal pad and the second metal pad,
wherein the peripheral circuit area includes a control logic configured to perform a program operation,
wherein the control logic includes a determination circuit that is configured to determine whether to perform one of a single-pulse program operation and a multi-pulse program operation according to a program condition,
wherein the single-pulse program operation includes applying a first program pulse and applying a plurality of verification pulses,
the multi-pulse program operation includes applying a second program pulse, applying a third program pulse after the second program pulse, followed by applying a plurality of verification pulses, and
each of the second program pulse and the third program pulse has a level lower than a level of the first program pulse.

12. The storage device of claim 11, wherein the program condition includes one of a number of program loops and a level of a program pulse, pass/fail information of a specific program state, and data stored in a predetermined register.

13. The storage device of claim 11, wherein applying the plurality of verification pulses includes applying verification pulses in sequence, starting from high-level pulse proceeding to lower level pulses.

14. The storage device of claim 11, wherein in the multi-pulse program operation, a bitline recovery operation is not performed after the second program pulse is applied, and the bitline recovery operation is performed after the third program pulse is applied.

15. The storage device of claim 11, wherein the at least one nonvolatile memory device further includes a flag register configured to store multi-pulse flag data,
wherein the multi-pulse flag data indicates one of the single-pulse program operation and the multi-pulse program operation.

16. A nonvolatile memory device comprising:
a memory cell array including a plurality of memory blocks having a plurality of memory cells connected to a plurality of wordlines and a plurality of bitlines;
a row decoder configured to select one of the plurality of wordlines;
a page buffer circuit having a plurality of page buffers connected to the plurality of bitlines; and
a control logic configured to receive a command latch enable (CLE) signal, an address latch enable (ALE) signal, a chip enable (CE) signal, a write enable (WE) signal, a read enable (RE) signal, and a DQS signal through control pins, and to perform a program operation by latching a command or an address at an edge of the WE signal in response to the CLE signal and the ALE signal,
wherein the control logic includes a determination circuit configured to determine whether to perform one of a single-pulse program operation and a multi-pulse program operation according to a program condition,
wherein the single-pulse program operation includes applying a first program pulse and applying a plurality of verification pulses,
the multi-pulse program operation includes applying a second program pulse, applying a third program pulse after the second program pulse, followed by applying a plurality of verification pulses, and each of the second program pulse and the third program pulse has a level lower than a level of the first program pulse.

17. The nonvolatile memory device of claim 16, wherein the program condition includes one of a number of program loops and a level of a program pulse, pass/fail information of a specific program state, and data stored in a predetermined register.

18. The nonvolatile memory device of claim 16, wherein applying the plurality of verification pulses includes applying verification pulses in sequence, starting from high-level pulse proceeding to lower level pulses.

19. The nonvolatile memory device of claim 16, wherein in the multi-pulse program operation, a bitline recovery operation is not performed after the second program pulse is applied, and the bitline recovery operation is performed after the third program pulse is applied.

20. The nonvolatile memory device of claim 16, wherein the nonvolatile memory device further includes a flag register configured to store multi-pulse flag data,
wherein the multi-pulse flag data indicates one of the single-pulse program operation and the multi-pulse program operation.

\* \* \* \* \*